(12) United States Patent
Smith et al.

(10) Patent No.: US 7,292,020 B1
(45) Date of Patent: Nov. 6, 2007

(54) REMOTE DC-DC CONVERTER FOR HIGH CURRENT, LOW VOLTAGE APPLICATIONS

(75) Inventors: Lawrence D. Smith, San Jose, CA (US); Prabhansu Chakrabarti, Sunnyvale, CA (US); William H. Schwartz, San Diego, CA (US)

(73) Assignee: Sun Microsysytems, Inc., Santa Clara, CA (US)

( * ) Notice: Subject to any disclaimer, the term of this patent is extended or adjusted under 35 U.S.C. 154(b) by 422 days.

(21) Appl. No.: 11/069,433

(22) Filed: Mar. 1, 2005

(51) Int. Cl.
*H03H 1/00* (2006.01)
*G06F 1/04* (2006.01)

(52) U.S. Cl. .................. 323/364; 327/294; 327/172

(58) Field of Classification Search .......... 327/172, 327/294; 323/364; 361/748, 750
See application file for complete search history.

(56) References Cited

U.S. PATENT DOCUMENTS 6,055,165 A * 4/2000 Drobnik ............... 363/44
6,262,905 B1 * 7/2001 Zhang et al. ............ 363/127
6,933,706 B2   8/2005 Shih
6,940,262 B2   9/2005 Dequina et al.
6,943,535 B1   9/2005 Schiff \* cited by examiner

*Primary Examiner*—Shawn Riley
(74) *Attorney, Agent, or Firm*—Meyertons Hoof Kivlin Kowert & Goetzel, P.C.; Erik A. Heter

(57) ABSTRACT

A remote voltage regulator module (VRM) for high-current, low voltage applications. In one embodiment, an electronic system includes a VRM configured to provide a DC output voltage. The VRM is coupled to a load board via a first bus bar and a second bus bar. The VRM includes a first capacitance of a first amount, while the load board includes a second capacitance of a second amount. A loop between the VRM and the load board is formed by the first and second bus bars and first and second capacitances. The loop is characterized by a transfer function that is second order or less.

27 Claims, 4 Drawing Sheets

REMOTE DC-DC CONVERTER FOR HIGH CURRENT, LOW VOLTAGE APPLICATIONS

BACKGROUND OF THE INVENTION

1. Field of the Invention

This invention relates to electronic systems, and more particularly, to DC-DC converters for power distribution systems.

2. Description of the Related Art

Efficient DC-DC converters are used to generate high currents at low voltages for many modern computer systems. Typically, these DC-DC converters are place on the same printed circuit board (PCB) as those circuits to which they are providing power. However, placing the DC-DC converter on the PCB may be undesirable from a reliability point of view. It would be more desirable from a reliability standpoint to place the converter on a different FRU (field replaceable unit), wherein the PCB and the DC-DC converter could be replaced independent of one another.

In a power distribution system, inductance (and more particularly, inductive impedance) between the DC-DC converter (or a voltage regulator) and the load is undesirable. Such inductive impedance can lead to higher levels of noise in the power distribution system, and this in turn can cause the release of electromagnetic energy that results in EMI (electromagnetic interference) or EMC (electromagnetic coupling). Power distribution system noise is a product of its impedance and its current. Thus, it is especially important to keep impedance at a minimum in today's computer systems, which often draw a high amount of current.

Inductive impedance in a power distribution system may be reduced by the use of decoupling capacitors. However, ESL, or Equivalent Series Inductance (sometimes referred to as mounted inductance) may reduce the effect of providing decoupling capacitors. The ESL of a capacitor is that inductance associated with its mounting on a printed circuit board (PCB) or other circuit carrier. A capacitor's ESL is a function of both the internal capacitor characteristics and its mounting on the PCB (which includes various factors such as mounting geometry of the capacitor).

In placing a DC-DC converter on a different FRU than the circuit to which power is being provided to, a significant amount of inductance may be introduced in the connection between the two, including inductance on the FRU itself. To counter the FRU inductance (and thereby reduce the impedance), a relatively large amount of capacitance may be implemented near the DC-DC converter. The capacitance may ensure that the output of the DC-DC converter is stable and smooth. However, this does not counter the inductance in the connectors and bus bars between the DC-DC converter and the load. As such, a significant amount of capacitance is also required at the load in order to ensure a low-impedance current path from the DC-DC converter.

Implementing a large amount of capacitance implemented on the DC-DC converter and the load board may result in additional poles and zeros in the transfer function that describes the relationship of the power input to the power output. In some cases, this transfer function may be a fourth-order equation, and as such, stabilizing the power distribution system becomes more difficult. Furthermore, adding a large amount of capacitance to both the DC-DC converter and the load board can drive up the cost of both.

SUMMARY OF THE INVENTION

A remote voltage regulator module (VRM) for high-current, low voltage applications is disclosed. In one embodiment, an electronic system includes a VRM configured to provide a DC output voltage. The VRM is coupled to a load board via a first power connector and a second power connector. The VRM includes a first capacitance of a first amount, while the load board includes a second capacitance of a second amount. A loop between the VRM and the load board is formed by the first and second bus bars and first and second capacitances. The loop is characterized by a transfer function that is second order or less.

In one embodiment, the first capacitance is implemented by a first plurality of capacitors, while the second capacitance is implemented by a second plurality of capacitors. The amount of the first capacitance may be an order of magnitude greater than the amount of the second capacitance. The first power connector may comprise a first bus bar, while the second power connector may comprise a second bus bar, wherein each bus bar includes first and second conductors separated by a dielectric. Each of the first and second bus bars may provide additional capacitance to the first and second capacitances, respectively.

In various embodiments, the VRM may be a multiphase DC-DC converter. The multiphase DC-DC converter produces a fundamental frequency for each of the phases. Noise corresponding to a ripple frequency may be produced by the multiphase DC-DC converter. The ripple frequency is the produce of the fundamental frequency and the number of phases. The electrical characteristics of the capacitors selected to provide the first capacitance (on the multiphase DC-DC converter) may be chosen in order to suppress the ripple frequency. In one embodiment, the capacitance is selected to be just enough to suppress the ripple frequency, but does not provide sufficient capacitance for decoupling the DC-DC converter.

BRIEF DESCRIPTION OF THE DRAWINGS

Other aspects of the invention will become apparent upon reading the following detailed description and upon reference to the accompanying drawings in which.

Figure 1:
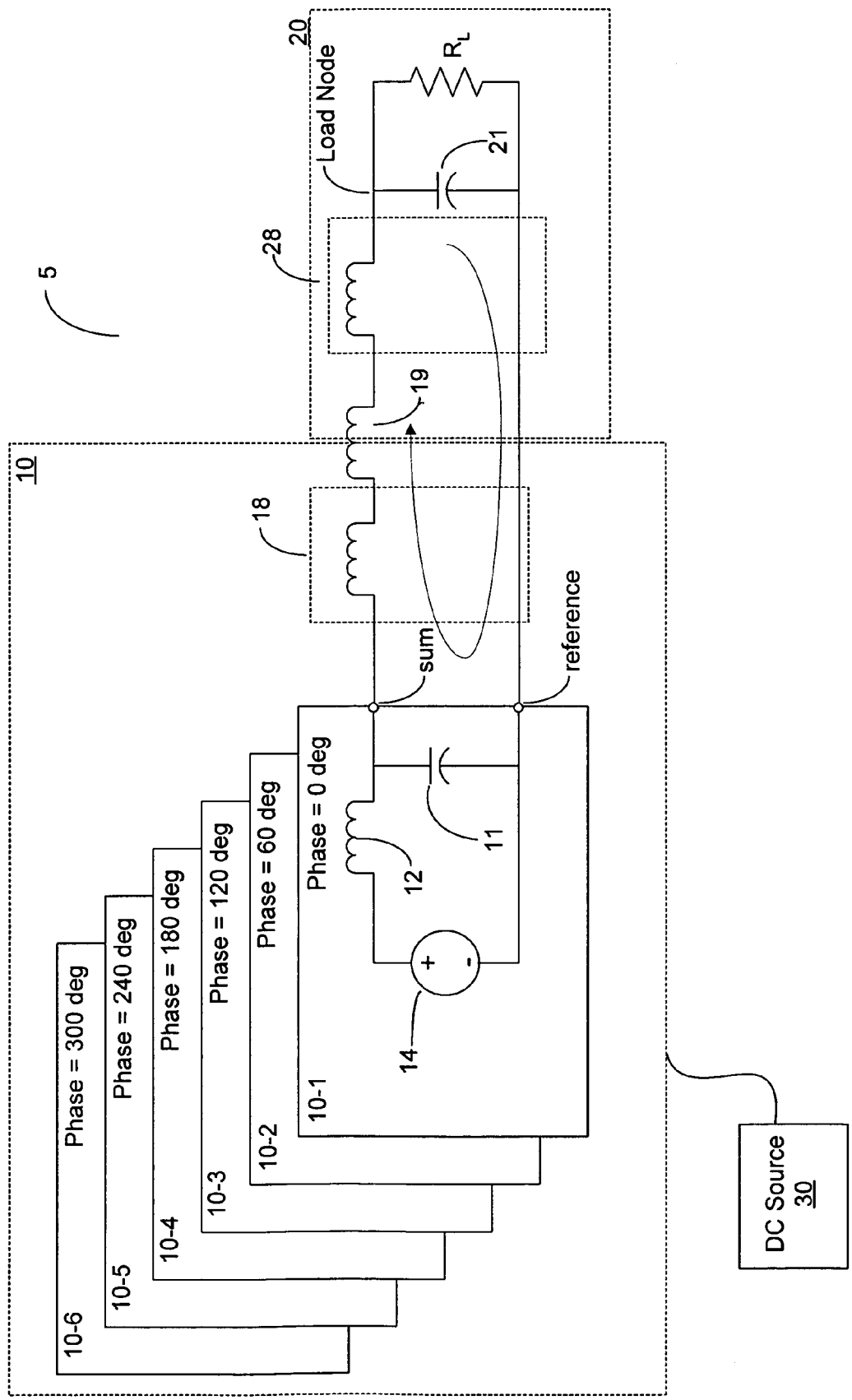
FIG. 1 is a schematic diagram of one embodiment of an electronic system including a load board coupled to receive a DC voltage from a voltage regulator module (VRM)

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1, is a schematic diagram of one embodiment of an electronic system including a load board coupled to receive a DC voltage from a voltage regulator module (VRM) is shown. In the embodiment shown electronic system 5 includes a VRM 10 coupled to a load board 20. Load board 20 may be one of many different types of boards for an electronic system, such as a system board for a server system.

In the embodiment shown, VRM 10 is a DC-DC converter, and is coupled to receive DC power from DC source 30. More particularly, VRM 10 in this embodiment is a multiphase DC-DC converter. A multiphase DC-DC converter includes a plurality of square wave generators 14 (one for each phase), wherein the output of each of the square wave generators provides a portion of the DC output. In this particular example, VRM 10 is a six-phase DC-DC converter. A first phase 10-1 provides the DC output from 0 to 60 degrees, a second phase 10-2 provides the DC output from 60 to 120 degrees, and so forth. Such multiphase DC-DC converters are commonly used in high-current, low voltage applications, as the stress on individual components is distributed among the phases instead of being concentrated in a single phase.

Each square wave generator 14 of VRM 10 is coupled between a sum node and a reference node. More particularly, the sum node is that node where the DC output voltage is present during operation of VRM 10, while the reference node is a node to which the DC output voltage is referenced to (e.g., a ground node). A working inductor 12 is coupled between the positive output of each square wave generator 14 and the sum node. A first capacitance 11 (which will be discussed in greater detail below) is coupled between the sum node and the reference node. The first capacitance may be implemented using one or more capacitors mounted to a circuit board of VRM 10.

VRM 10 is coupled to load board 20 via a pair of bus bars (bus bar 18 and bus bar 28) and a connector 19. Each of these elements is illustrated here as an inductor on the path through which voltage is conveyed from VRM 10 to load board 20. The inductor or inductors represent the inductance present in the connection between VRM 10 and load board 20 (although an exemplary bus bar will be illustrated in FIG. 2). Each of the bus bars and the connector may provide a significant amount of inductance. Each of the bus bars 18 and 28, as well as connector 19 also includes connections to the reference node and thus provides a return path.

Resistor $R_L$ shown here is intended to represent the load circuitry on load board 20. This circuitry may include a wide variety of integrated circuits as well as discrete components, and may be analog or digital. Examples of the various circuitry that may be implemented on load board 10 (the sum of which is represented by resistor $R_L$) includes one or more processors, bus bridges, application specific integrated circuits (ASICs), resistors, capacitors, inductors, and so forth.

Load board 20 includes a second capacitance 21, which may be implemented using a plurality of capacitors. The second capacitance 21 provides decoupling of the power distribution system, and may also provide an impedance profile over a wide frequency range that meets target impedance specifications for the load board. As such, the second capacitance 21 may be implemented using a variety of capacitors having various electrical characteristics. The capacitors of second capacitance may be chosen based on characteristics such as capacitance, equivalent series resistance, resonant frequency, and mounted inductance. The choices of the various capacitors included in capacitance 21 may be driven by factors such as the frequency and amplitude of system anti-resonant peaks and the general impedance profile of load board 20.

When VRM 10 is coupled to load board 20, a loop is formed. This loop passes through first capacitance 11, first bus bar 18, connector 19, second bus bar 28, and second capacitance 21, and includes the return path to the reference node. The operation of this loop may be characterized by a transfer function. This transfer function may be characterized in the time domain by a differential equation, or, in the frequency domain, by a Laplace transform of the differential equation. In one embodiment, the amount of the first capacitance 11 is chosen such that the loop transfer function is a second order transfer function (i.e. characterized by a second order equation). Other embodiments wherein the transfer function is of a lower order (e.g., first order) are possible and contemplated.

It is important to note that the first capacitance 11 on VRM 10 is not intended for the particular purpose of providing decoupling for the power distribution system, as opposed to second capacitance 21 on load board 20. The amount of the first capacitance is chosen primarily to suppress a ripple frequency, while maintaining a loop transfer function that is represented by a second order equation. The ripple frequency may be a product of a fundamental frequency and the number of phases in the multiphase DC-DC converter (VRM 10). The fundamental frequency may correspond to a frequency for each of the square wave generators 14 distributed among the phases of VRM 10. For example, if the fundamental frequency of each the square wave generators 14 is 1 MHz, then the ripple frequency for the six-phase DC-DC converter shown here as VRM 10 is 6 MHz.

The amount of capacitance chosen for the first capacitance may be just sufficient for suppressing the ripple frequency but insufficient for providing decoupling. Since the amount of the first capacitance 11 is chosen to suppress the ripple frequency but not for decoupling purposes, the amount of the second capacitance 21 may be significantly greater. The amount of the second capacitance 21 is chosen in order to be able to provide current during system transients (e.g., simultaneous switching) until VRM 10 can respond. The amount of the second capacitance 21 may be at least an order of magnitude greater than the amount of the first capacitance 11 in some embodiments. Without the large amount of the second capacitance 21 in relation to the first capacitance 11, electronic system 5 might be subject to a significant power supply 'droop' during system transients. This is due in part to the fact that the amount of the first capacitance 11 would not be great enough to supply the required current at the specified voltage, particularly in high-current, low voltage electronic systems (e.g., 150 amps at 1.5 volts). Furthermore, the first capacitance may be selected to suppress frequencies over a limited frequency range centered around the ripple frequency, whereas the second capacitance may be selected to suppress frequencies over a much broader frequency range.

If the amount of the first capacitance 11 is increased in order to provide enough capacitance to meet the demand for transients, it may become more difficult to stabilize the loop. Additional capacitance added to VRM 10 may result in the transfer function for the loop becoming a fourth order equation, which is significantly more difficult to stabilize. Thus, the amount of the first capacitance is limited in order to maintain a loop transfer function that is at most a second order equation while providing just enough capacitance to suppress the ripple frequency. With this amount of capacitance on the VRM, a view of the output on an oscilloscope taken either at the sum node may appear noisy and relatively unstable. However, when this output is viewed at the sum node when VRM 10 is coupled to load board 20, the output may appear smooth and stable.

Figure 2:
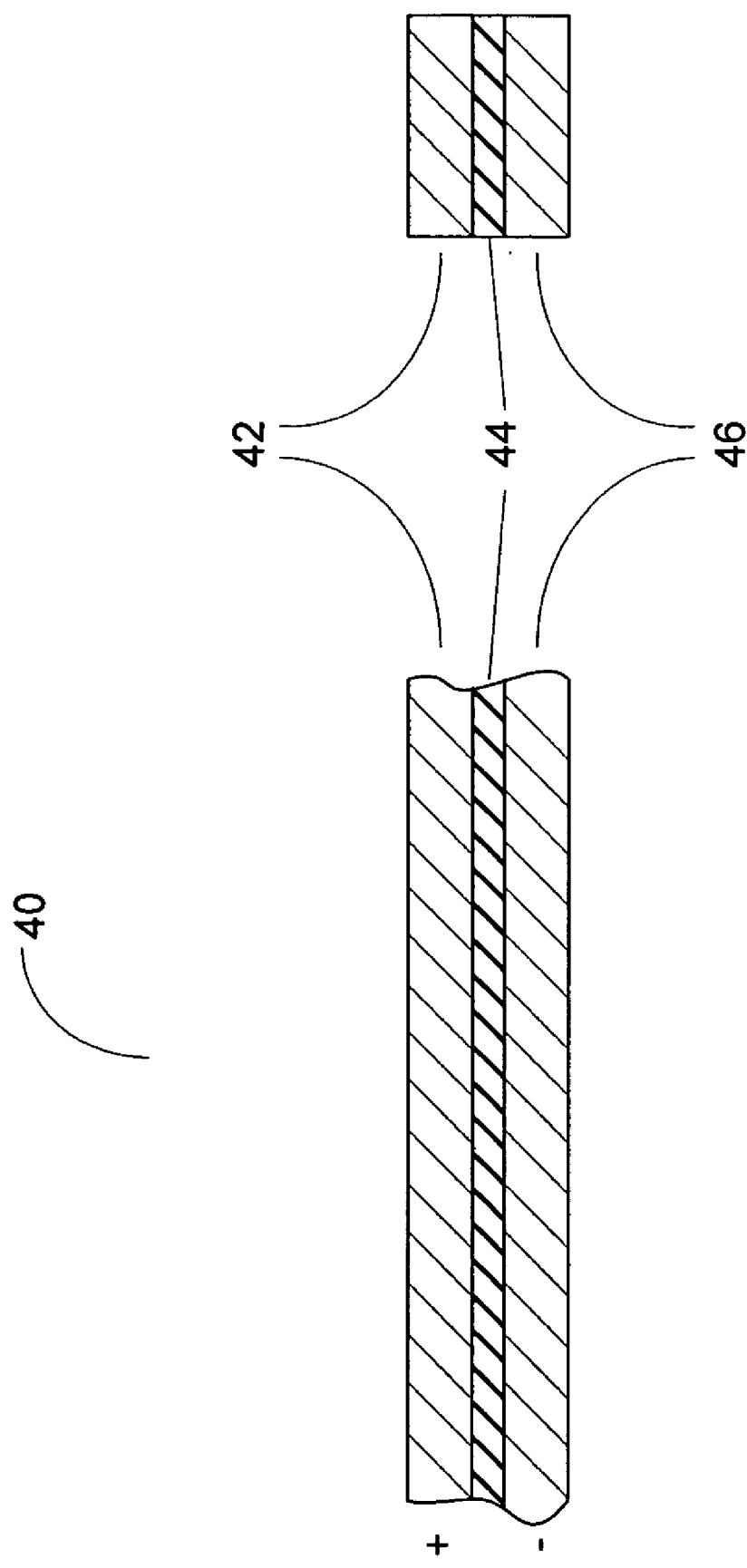
FIG. 2 is a drawing of one embodiment of a portion of a bus bar used to couple a VRM to a load board.

FIG. 2 is a drawing of one embodiment of a portion of a bus bar which may be used to couple a VRM to a load board. More particularly, FIG. 2 shows a side view and a cross section of a portion of an exemplary bus bar. Bus bar 40 shown in this embodiment may be similar to bus bars 18 and 28 discussed above in reference to FIG. 1. Each of the VRM and the load board include a bus bar, and at least one of them may include a connector for coupling with the other (and each of them may include complementary connectors). In general, each of the bus bars serves as a power conductor for conveying power from the VRM to the load board, and additionally, providing a return path.

In the embodiment shown, bus bar 40 includes two conductive layers 42 and 46 separated by a dielectric layer 44. The conductive layers 42 and 46 may be made of any suitable conductive material, such as copper. Similarly, dielectric layer 44 may be made of any suitable dielectric material. Embodiments having additional conductive layers and additional dielectric layers are possible and contemplated.

In this particular embodiment, conductive layer 42 is configured for coupling to a voltage node, such as the sum node illustrated in FIG. 1. Similarly, conductive layer 46 is configured for coupling to a reference or ground node, such as the reference node shown in FIG. 1. Thus, bus bar 40 of the embodiment shown may be suitable for coupling a VRM to a load board, providing a connection for both the supplied voltage as well as the connection to the reference node.

Figure 3:
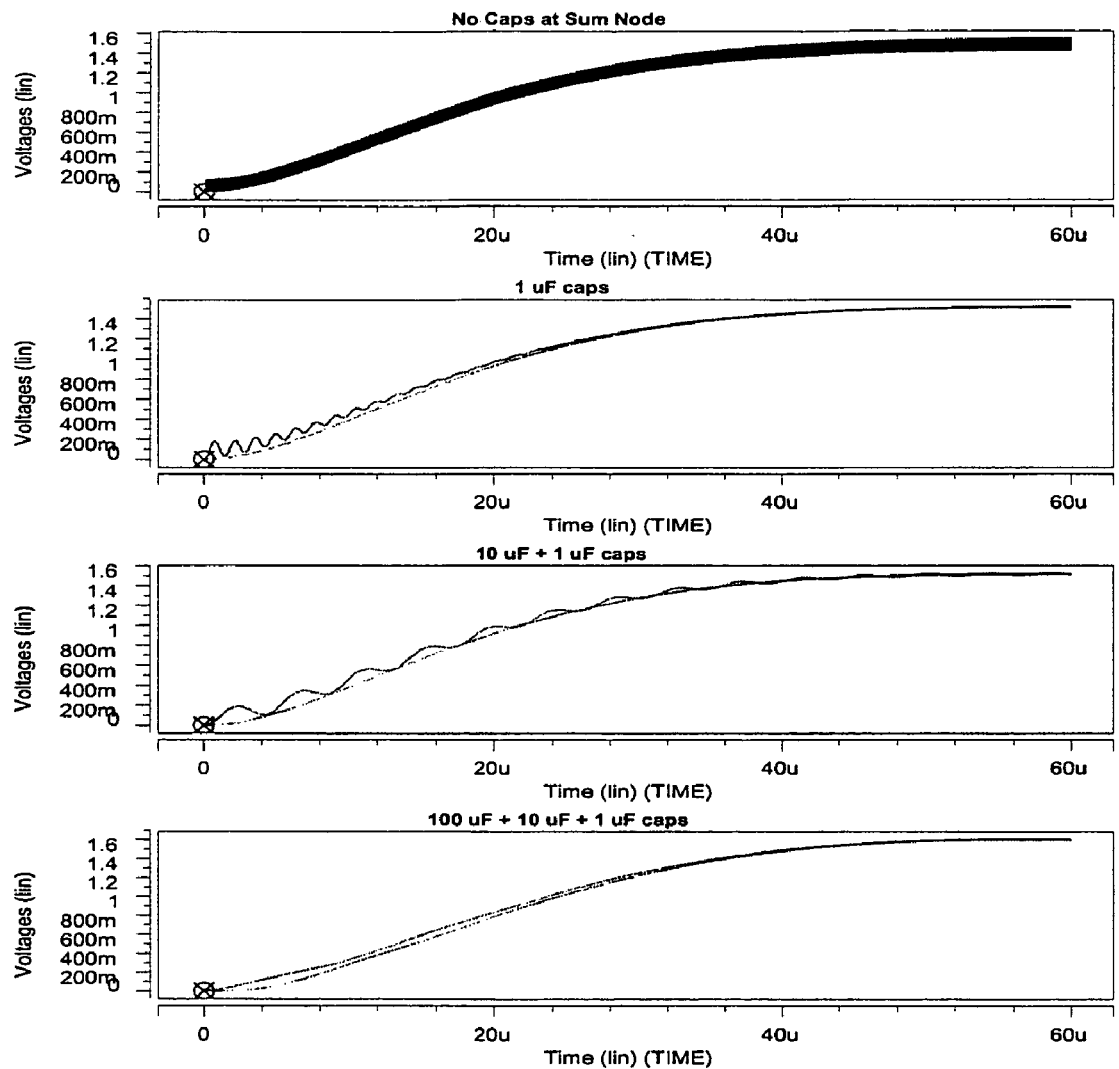
FIG. 3 is a series of diagrams illustrating a transient simulation of one embodiment of an electronic system at system startup, wherein the electronic system includes a VRM coupled to a load board.

Turning now to FIG. 3, a series of diagrams illustrating a transient simulation of one embodiment of an electronic system at system startup, wherein the electronic system includes a VRM coupled to a load board is shown. The first diagram illustrates the transient response measured at the sum node for the startup of a VRM similar to the one discussed in reference to FIG. 1. However, in the first diagram, the VRM includes no capacitance for suppressing a ripple frequency. Thus, as shown in the first diagram, the ripple frequency dominates the response, and even as the voltage curve stabilizes, the voltage varies between approximately 1.5 volts and 1.3 volts. This voltage ripple may cause erroneous operation of various circuits of the load board.

In the second diagram, an example is shown wherein a 1-μF capacitor has been added to provide a capacitance on the VRM (which may correspond to first capacitance 11 of FIG. 1). Upon startup, a significant amount of voltage ripple is present. This voltage ripple is of a lower frequency than that shown in the first diagram, indicating that a portion of the initial voltage ripple has been eliminated. However, the voltage ripple still persists and may cause problems during system startup and subsequent operation.

In the third diagram, an example is shown of the startup response wherein, in addition to the 1 μF. capacitor, a 10 μF has also been added to the capacitance on the VRM. The remaining voltage ripple is of a lower frequency than that shown in either of the previous two diagrams, indicating that even more voltage ripple has been suppressed. However, this voltage ripple persists through startup and into the point where the voltage curve should be stabilized.

The fourth diagram is an example showing the startup response after having added a 1 μF, 10 μF, and a 100 μF. to the VRM. As can be seen in the curve of the diagram, voltage ripple at this point has been virtually eliminated. The startup response shown in the diagram illustrates a relatively steady rise in the VRM voltage until it stabilizes at its target voltage of approximately 1.5 volts. Thus, in this particular example, a capacitance total of 1 μF is sufficient to eliminate ripple on the output voltage and thus allows VRM to supply a smooth, steady voltage to a load board.

Figure 4:
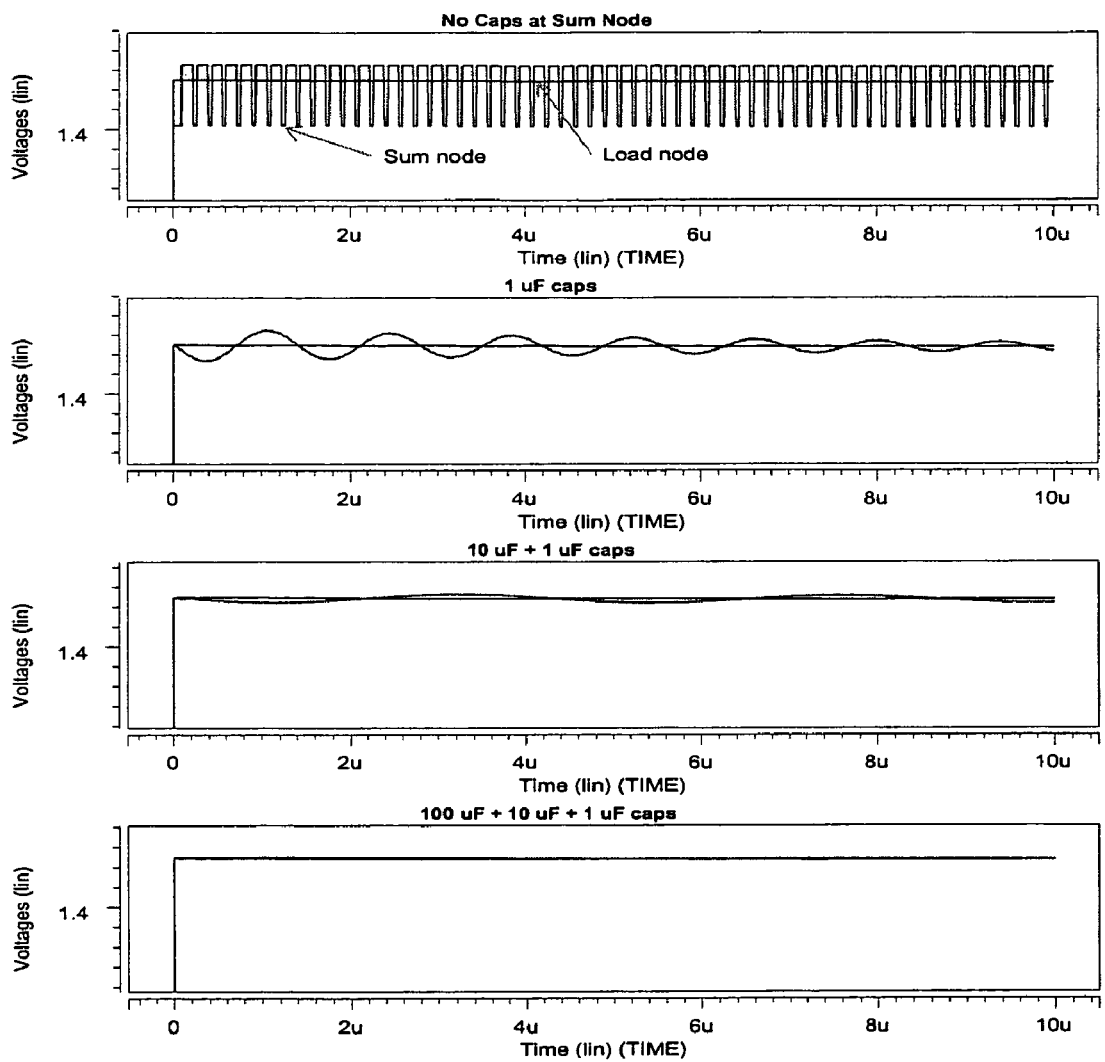
FIG. 4 is a series of diagrams illustrating a transient simulation of one embodiment of an electronic system in its steady state, wherein the electronic system includes a VRM coupled to a load board.

Moving now to FIG. 4, a series of diagrams illustrating a transient simulation of one embodiment of an electronic system in its steady state, wherein the electronic system includes a VRM coupled to a load board is shown. The transient may be any type of transient that suddenly increases or decreases current demand from the VRM, such as the simultaneous switching of a large number of circuits.

As with FIG. 3, the response illustrated in the graphs is measured at the sum node of a VRM, such as that of FIG. 1. In the first diagram, the VRM includes no capacitors, and a significant amount of ripple is present at the sum node. A desired voltage at the load node (e.g., the load node of FIG. 1) is shown for comparison. With the large amount of ripple present, it normal system operation may not be possible.

In the second diagram, a 1 μF has been added to the VRM. As result of adding this capacitance, the ripple from the sum node has been reduced in both amplitude and frequency. Furthermore, the amplitude of the ripple decreases with time. Regardless, the amount of ripple may still be too great for normal system operation, as a system transient may cause erroneous operation of various circuits on the load board.

In the third diagram, capacitors of 1 μF. and 10 μF have been added to the VRM for a total of 11 μF. As can be seen in the diagram, both the amplitude and the frequency of the ripple is less than that of the second diagram. However, in this case, the ripple does not decrease in amplitude with time as quickly as the case illustrated in FIG. 2. Thus, following a system transient, the amount of ripple will remain longer, and thus may affect system operation following the transient.

In the fourth diagram, a total of 111 μF has been added to the VRM. In this particular example, virtually no voltage ripple is present after the transient. The voltage measured at the sum node remains equal to the voltage desired at the load node following the transient.

It should be noted that the diagrams of FIG. 3 and FIG. 4 are for exemplary purposes only, and the amount of capacitance necessary to suppress voltage ripple from a VRM such as those discussed here may vary. Furthermore, for the embodiments shown herein, the amount of capacitance may be altered while still achieving acceptable results. For example, it may be possible to suppress the voltage ripple using 110 μF instead of 111 μF.

It is further noted that the amount of capacitance placed on the VRM may not be sufficient for providing decoupling or suppressing system anti-resonant peaks when coupled to the load board. Typically, a significant amount of capacitance is required on the load board itself to perform this function. The capacitance required for decoupling may further be selected to provide a low impedance over a wide range of frequencies. The capacitance on the VRM may be limited to that amount necessary for suppressing the voltage ripple, and may further be limited to a relatively narrow frequency range centered around the voltage ripple frequency. Furthermore, the amount of capacitance on the VRM may be limited such that the loop transfer function (for a loop such as that shown in FIG. 1) is represented by an equation that is second order or less. Addition of more capacitance than necessary to adequately suppress the ripple may result in a transfer function that is represented by an equation of a higher order (e.g., a fourth order equation), and may thus be more difficult to stabilize due to the greater number of poles.

In other words, the capacitance of the VRM may be relatively small (compared to that of the load board) and suppresses frequencies over a limited range (centered around the frequency of the voltage ripple). In contrast, the capacitance of the load board may be large relative to that of the VRM, and may suppress frequencies over a much wider frequency range.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An electronic system comprising:
    a voltage regulator module (VRM) configured to provide a DC output voltage, wherein the VRM includes a first capacitance of a first amount, wherein the VRM includes a first power conductor; and
    a load board coupled to receive the DC output voltage from the VRM, wherein the loadboard includes a second capacitance of a second amount, wherein the load board is includes a second power conductor configured for coupling to the first power conductor; and
    wherein the first capacitance, the first power conductor, the second capacitance, and the second power conductor form a loop characterized by a transfer function that is second order or less.

2. The electronic system as recited in claim 1, wherein the second amount of capacitance is at least an order of magnitude greater than the first amount.

3. The electronic system as recited in claim 1, wherein the VRM is a DC-DC converter.

4. The electronic system as recited in claim 3, wherein the VRM is a multi-phase DC-DC converter.

5. The electronic system as recited in claim 4, wherein the VRM is a six-phase DC-DC converter.

6. The electronic system as recited in claim 4, wherein the first capacitance is provided by a first plurality of capacitors.

7. The electronic system as recited in claim 6, wherein the electrical characteristics of the first plurality of capacitors are chosen to suppress a ripple frequency.

8. The electronic system as recited in claim 7, wherein the ripple frequency is a product of a fundamental frequency and a number of phases of the multi-phase DC-DC converter.

9. The electronic system as recited in claim 4, wherein each phase of the multi-phase DC-DC converter includes a square wave generator, a working inductor, and a portion of the first capacitance.

10. The electronic system as recited in claim 9, wherein the portion of the first capacitance is coupled between a sum node and a reference node.

11. The electronic system as recited in claim 1, wherein the first power conductor is a first bus bar and wherein the second power conductor is a second bus bar, wherein the first bus bar is configured to be coupled to the second bus bar.

12. The electronic system as recited in claim 11, wherein each of the first and second bus bars include a plurality of conductive layers and at least one dielectric layer arranged between two of the plurality of conductive layers.

13. A method comprising:
    providing a voltage regulator module (VRM), wherein the VRM is configured to provide a DC output voltage, wherein the VRM includes a first capacitance of a first amount;
    coupling the VRM to a load board using a first power conductor and a second power conductor, wherein the load board includes a second capacitance of a second amount; and
    providing the DC output voltage to the load board;
    wherein the first capacitance, the first power conductor, the second capacitance, and the second power conductor form a loop, and wherein the loop characterized by a transfer function that is second order or less.

14. The method as recited in claim 13, wherein the second amount of capacitance is at least an order of magnitude greater than the first amount.

15. The method as recited in claim 13, wherein the VRM is a DC-DC converter.

16. The method as recited in claim 15, wherein the VRM is a multi-phase DC-DC converter.

17. The method as recited in claim 16, wherein the VRM is a six-phase DC-DC converter.

18. The method as recited in claim 16, wherein the first capacitance is provided by a first plurality of capacitors.

19. The method as recited in claim 18, wherein the electrical characteristics of the first plurality of capacitors are chosen to suppress a ripple frequency.

20. The method as recited in claim 19, wherein the ripple frequency is a product of a fundamental frequency and a number of phases of the multi-phase DC-DC converter.

21. The method as recited in claim 16, wherein each phase of the multi-phase DC-DC converter includes a square wave generator, a working inductor, and a portion of the first capacitance.

22. The method as recited in claim 21, wherein the portion of the first capacitance is coupled between a sum node and a reference node.

23. The method as recited in claim 13, wherein the VRM includes the first power conductor and the load board includes the second power conductor, wherein each of the first and second power conductors are bus bars configured to be coupled to each other by a connector.

24. The method as recited in claim 23, wherein each bus bar includes a plurality of copper layers and at least one dielectric layer arranged between two of the plurality of copper layers.

25. A voltage regulator module comprising:
    a plurality of square wave generators, wherein each of the plurality of square wave generators is coupled between a sum node and a reference node, wherein each of the square wave generators is configured to generate a square wave, and wherein the square wave provides a portion of a DC output; and
    one or more capacitors, wherein a the one or more capacitors provide a capacitance between the sum node and the reference node;
    wherein the voltage regulator module is a multi-phase voltage regulator configured to generate the DC output in a plurality of phases, and wherein each of the plurality of square wave generators corresponds to one of the plurality of phases, and wherein the amount of capacitance is chosen to be sufficient to suppress a ripple frequency but insufficient to provide decoupling between the sum node and the reference node.

26. The voltage regulator module as recited in claim 25, wherein the voltage regulator module is a DC-DC converter.

27. The voltage regulator module as recited in claim 25, wherein the ripple frequency is the product of a fundamental frequency and a total number of the plurality of phases.

* * * * *